United States Patent
Wu et al.

(10) Patent No.: US 11,450,525 B2
(45) Date of Patent: Sep. 20, 2022

(54) SELECTIVE ALUMINUM OXIDE FILM DEPOSITION

(71) Applicant: Applied Materials, Inc., Santa Clara, CA (US)

(72) Inventors: Liqi Wu, San Jose, CA (US); Hung Nguyen, San Jose, CA (US); Bhaskar Jyoti Bhuyan, San Jose, CA (US); Mark Saly, Santa Clara, CA (US); Feng Q. Liu, San Jose, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 16/131,931

(22) Filed: Sep. 14, 2018

(65) Prior Publication Data
US 2020/0090924 A1 Mar. 19, 2020

(51) Int. Cl.
| | |
|---|---|
| *H01L 21/00* | (2006.01) |
| *H01L 21/02* | (2006.01) |
| *C23C 16/04* | (2006.01) |
| *C23C 16/20* | (2006.01) |

(52) U.S. Cl.
CPC .......... *H01L 21/0228* (2013.01); *C23C 16/04* (2013.01); *H01L 21/02178* (2013.01); *H01L 21/02205* (2013.01); *H01L 21/02244* (2013.01); *C23C 16/20* (2013.01)

(58) Field of Classification Search
None
See application file for complete search history.

(56) References Cited

U.S. PATENT DOCUMENTS

| | | | |
|---|---|---|---|
| 9,895,715 B2 | 2/2018 | Haukka et al. | |
| 2001/0006835 A1* | 7/2001 | Kim | C23C 8/02 438/250 |
| 2016/0145738 A1 | 5/2016 | Liu et al. | |
| 2017/0040164 A1* | 2/2017 | Wang | H01L 21/02178 |
| 2017/0096345 A1 | 4/2017 | Shero et al. | |
| 2017/0154806 A1 | 6/2017 | Wang et al. | |
| 2018/0010247 A1 | 1/2018 | Niskanen et al. | |
| 2018/0261447 A1 | 9/2018 | Smith et al. | |

FOREIGN PATENT DOCUMENTS

| | | |
|---|---|---|
| JP | 2018011057 A | 1/2018 |
| WO | 2018/098027 A1 | 5/2018 |

OTHER PUBLICATIONS

PCT International Search Report and Written Opinion in PCT/US2019/050501 dated Jan. 20, 2020, 11 pages.

* cited by examiner

*Primary Examiner* — Reema Patel
(74) *Attorney, Agent, or Firm* — Servilla Whitney LLC

(57) ABSTRACT

Methods of depositing films are described. Specifically, methods of depositing metal oxide films are described. A metal oxide film is selectively deposited on a metal layer relative to a dielectric layer by exposing a substrate to an organometallic precursor followed by exposure to an oxidant.

14 Claims, 6 Drawing Sheets

SELECTIVE ALUMINUM OXIDE FILM DEPOSITION

TECHNICAL FIELD

Embodiments of the present invention pertain to the field of electronic device manufacturing and methods for device patterning. More particularly, embodiments of the disclosure provide methods for depositing aluminum oxide films.

BACKGROUND

Semiconductor technology has advanced at a rapid pace and device dimensions have shrunk with advancing technology to provide faster processing and storage per unit space. As dimensions reach 7 nm, patterning using lithography becomes not only extremely challenging but also very expensive. Selective deposition is an alternative, which can preclude the need for costly lithographic patterning.

Recently there has been interest in dielectric blocking on dielectric materials. One existing solution is to use lithography to mask one surface, but this method is critically limited by alignment errors. Another solution is to use self-assembled monolayers (SAMs) selectively adsorbed to the dielectric to selectively block subsequent ALD growth. Ideally, self-assembled monolayers (SAMs) deposit selectively on a dielectric substrate with little growth on the metal substrate, allowing metal oxides (e.g. aluminum oxide, etc.) to grow on metal while no metal oxide grows on the dielectric, as SAMs block them. There is, however, metal oxide deposition on the dielectric because, during metal oxide film deposition, metal and water precursors start growing on the dielectric/SAMs due to the ease of absorption of some metal precursors and water in the layer of the SAM or dielectric. Conventional use of trimethyl aluminum (TMA) and water to deposit aluminum oxide does not meet selectivity requirements. Selectivity requirements, therefore, are not met. Accordingly, there is a need for methods of selectively depositing aluminum oxide films, while also providing aluminum oxide films having desirable properties.

SUMMARY

Methods to manufacture integrated circuits are described. In one or more embodiments, a method of depositing a film is described. The method comprises positioning a substrate having a metal layer and a dielectric layer in a processing chamber. The substrate is exposed to an organometallic precursor to selectively deposit a metal film on the metal layer relative to the dielectric layer. The processing chamber is purged of the organometallic precursor. The substrate is exposed to an oxidant to react with the metal film to form a metal oxide film on the metal layer. The processing chamber is purged of the oxidant.

In one or more embodiments, a method of depositing a film is described. The method comprises selectively forming a metal oxide film in a process cycle comprising sequential exposure of a substrate having a metal layer and a dielectric layer thereon to an organometallic precursor, purge gas, an oxidant, and purge gas. The process cycle is repeated to selectively form a metal oxide film on the metal layer, the metal oxide film having a thickness of about 0.5 nm to about 10 nm, and the dielectric layer substantially free of the metal oxide film.

In one or more embodiments, a method of depositing a film is described. The method comprises selectively forming an aluminum oxide film in a process cycle comprising sequential exposure of a substrate having a metal layer adjacent to a dielectric layer to an aluminum precursor, purge gas, oxidant, and purge gas. The process cycle is repeated to selectively form the aluminum oxide film on the metal layer, the aluminum oxide film having a thickness of about 2 nm to about 10 nm, and the dielectric layer substantially free of aluminum oxide.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
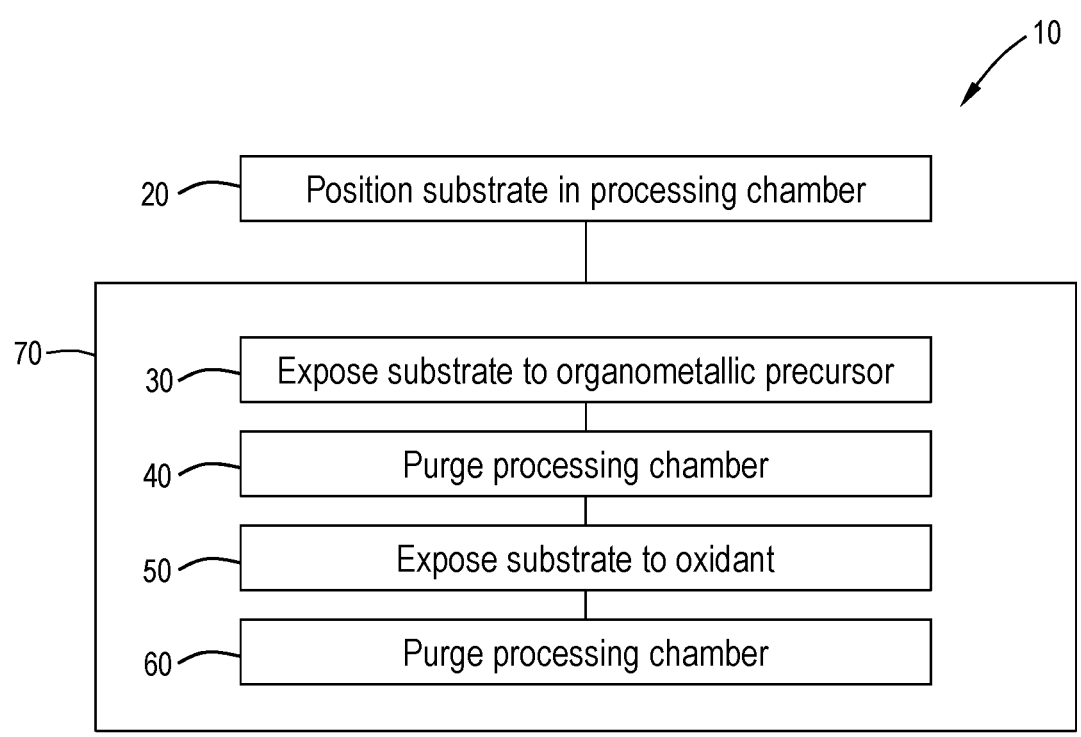
FIG. 1 depicts a flow process diagram of one embodiment of a method of forming a thin film according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

As used herein, the term "feature" or "topographic feature" refers to one or more of an opening, a trench, a via, a peak, or the like.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used herein, the term "dielectric" refers to an electrical insulator material that can be polarized by an applied electric field. In one or more embodiments, the dielectric material includes, but is not limited to, oxides, e.g., $SiO_2$, $Ta_2O_5$, $Al_2O_3$, nitrides, e.g., $Si_3N_4$, and barium strontium titanate (BST). In one or more embodiments, the dielectric material comprises silicon dioxide ($SiO_2$). In some embodiments, the film composition is non-stoichiometric relative to the ideal molecular formula. For example, in some embodiments, the dielectric material includes, but is not limited to, oxides (e.g., silicon oxide, tantalum oxide, aluminum oxide), nitrides (e.g., silicon nitride (SiN)), carbides (e.g. silicon carbide (SiC)), oxycarbides (e.g. silicon oxycarbide (SiOC)), oxynitrocarbides (e.g. silicon oxycarbonitride (SiNCO)), and barium strontium titanate (BST).

In one or more embodiments, the term "high-κ dielectric" refers to a material with a high dielectric constant (as compared to, e.g. silicon dioxide). In one or more embodiments, the high-κ dielectric material is selected from one or more of $HfO_2$, $ZrO_2$, $VO_2$, $TiO_2$, $SnO_2$, $Al_2O_3$, or ZnO. In one or more specific embodiments, the high-κ dielectric material comprises or consists essentially of $Al_2O_3$. As used herein, the term "consists essentially of" means that the composition of the bulk film comprises the elements specified in a sum totaling 95%, 98%, 99% or 99.5% of the total elemental composition by weight. In some embodiments, the high-K dielectric material comprises or consists essentially of aluminum atoms.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

In one or more embodiments, a dielectric blocking material is deposited on dielectric materials. Typically, lithography may be used to mask one surface, but this method is critically limited by alignment errors. Another solution is to use self-assembled monolayers (SAM) selectively adsorbed to the dielectric to selectively block subsequent ALD growth. This process is self-aligning but problematic in that it can allow some ALD growth on the dielectric, as well as some ALD blocking on the metal. SAM also leaves behind carbon contaminants on the surface. The method of one or more embodiments provides for selective deposition of a high-κ metal oxide material, e.g. aluminum oxide layer, on a metal layer. The deposition of the high-κ metal oxide material is selective against growth on the dielectric material (e.g. $SiO_2$/Si, silicon nitride (SiN), silicon oxide ($SiO_x$), silicon carbonitride (SiCN), and the like).

In one or more embodiments, when used with self-assembled monolayers (SAM), deposition using an aluminum precursor with a relatively large diameter in combination with an oxidant provides a more selective aluminum oxide film than a deposition using an aluminum precursor having a smaller diameter. In some embodiments, it is noted that the precursor may not be spherical in shape, and, thus, diameter describes the largest dimension cross-width. As used herein, the term "selective" means that deposition of the high-κ metal oxide material on the metal layer occurs instead of deposition on the dielectric material in a ratio greater than or equal to about 5:1, 10:1, 15:1, 20:1, 25:1, 30:1, 35:1, 40:1, 45:1, 50:1. 100:1, 200:1, 300:1, 400:1, 500:1, 1000:1, 1500:1, 2000:1, 2500:1, 3000:1, 3500:1, 4000:1, 4500:1, 5000:1, or more. In one or more embodiments, deposition of an aluminum oxide material on a metal layers occurs instead of deposition on a dielectric material in a ratio great than or equal to about 5:1, 10:1, 15:1, 20:1, 25:1, 30:1, 35:1, 40:1, 45:1, 50:1. 100:1, 200:1, 300:1, 400:1, 500:1, 1000:1, 1500:1, 2000:1, 2500:1, 3000:1, 3500: 1, 4000:1, 4500:1, 5000:1, or more.

Area-selective atomic layer deposition (ALD) using self-assembled monolayers (SAMs) as deposition blocking layers is a useful technique to apply advantages in nanoscale device and conventional device applications. SAMs can modify surface properties based on their tail molecules, for example changing surfaces to become hydrophobic. ALD, on the other hand, critically depends upon surface properties.

Selective deposition can be achieved using a SAM coating as a deposition blocking layer. As a result, area-selective atomic layer deposition enables the patterning of deposited layers without adding additional potentially expensive lithography or etching processes.

In addition to selective deposition of hafnium oxide, selective deposition of aluminum oxide is receiving more attention due to its potential in many applications such as, but not limited to, insulating layers, optical filters, protective coatings, or high-κ films in semiconductor device applications. Aluminum oxide films are commonly produced by chemical vapor deposition (CVD) or atomic layer deposition (ALD) using multiple kinds of aluminum sources.

In addition to the selectivity improvement, in one or more embodiments, using aluminum precursors having a large diameter also advantageously film properties for the high-κ metal oxide films that are comparable to the film properties provided by aluminum precursors having a small diameter.

FIG. 1 depicts a flow diagram of a method 10 of depositing a film in accordance with one or more embodiments of the present disclosure. With reference to FIG. 1, the method 10 comprises a deposition cycle 70. The method 10 begins at operation 20 by positioning a substrate into a processing chamber.

The substrate may be any substrate known to one of skill in the art. In one or more embodiments, the substrate comprises one or more semiconductor material, e.g., silicon (Si), silicon oxide ($SiO_2$), germanium (Ge), silicon germanium (SiGe), galloum arsenide (GaAs), indium phosphorus (InP), indium galloum arsenide (InGaAs), indium aluminum arsenide (InAlAs), molybdenum disulfide ($MoS_2$), molybdenum diselenide ($MoSe_2$), tungsten disulfide ($WS_2$), tungsten diselenide ($WSe_2$), titanium nitride (TiN), tantalum nitride (TaN), tungsten (W), platinum (Pt), or iridium (Ir). In some embodiments, the substrate may comprise a spacer, a metal gate, a contact, or the like. Thus, in one or more embodiments, the substrate may comprises a semiconductor material including, but not limited to, copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), zirconium (Zr), silicon carbonitride (SiCN), silicon oxycarbide (SiOC), silicon nitride (SiN), tungsten carbide (WC), tungsten oxide (WO), silicon oxycarbonitride (SiONC), or any semiconductor substrate material known to one of skill in the art.

At operation 30, the substrate is exposed in the processing chamber to an organometallic precursor to deposit a metal-containing film. In one or more embodiments, the organometallic precursor containing the desired metal may be pulsed or coflowed into the processing chamber with a flow gas or carrier gas. In other embodiments, the organometallic precursor containing the desired metal is pulsed into the processing chamber in the absence of a carrier gas. As used herein, the term "carrier gas" refers to a fluid (either gas or liquid) that can move a precursor molecule from one location to another. For example, a carrier gas can be a liquid that moves molecules from a solid precursor in an ampoule to an aerosolizer. In some embodiments, a carrier gas is an inert gas. In one or more embodiments, a carrier gas is one or more of argon (Ar), helium (He), xenon (Xe), or nitrogen ($N_2$).

At operation 40, the processing chamber is purged of the organometallic precursor. Purging can be accomplished with any suitable gas that is not reactive with the substrate, film on the substrate, and/or processing chamber walls. Suitable purge gases include, but are not limited to, $H_2$, $N_2$, He, and Ar. The purge gas may be used to purge the processing chamber of the organometallic precursor, and/or the oxidant. In some embodiments, the same purge gas is used for each purging operation. In other embodiments, a different purge gas is used for the various purging operations.

At operation 50, the substrate is exposed to an oxidant to react with the metal-containing film to form a metal oxide film. In one or more embodiments, the oxidant comprises one or more of oxygen, tert-butyl alcohol, 3-butene-2-ol, 2-methyl-3-butene-2-ol, 2-phenyl-2-propanol, or R—OH where R comprises $CF_3$ or $C_{1-20}$ alkyl, $C_{1-20}$ aryl, $C_{1-20}$ alkenyl, or $C_{1-20}$ alkynyl.

One or more embodiments advantageously provide a significant performance boost, showing that a high-κ metal oxide film (e.g. aluminum oxide film) deposited using a large diameter aluminum precursor provides much better selectivity. One or more embodiments advantageously provide a significant performance boost, showing that an aluminum oxide film deposited using a large diameter aluminum precursor instead of a small diameter aluminum precursor provides much better selectivity, particularly with self-assembled monolayers (SAM). Without intending to be bound by theory, it is thought that the method of one of more embodiments could solve the high value problem of selective aluminum oxide deposition while also providing an aluminum oxide film having desirable properties.

ALD growth of a high-κ dielectric film, such as aluminum oxide ($Al_xO_y$), requires sequential (or simultaneous) exposure of a substrate to an organometallic precursor and an oxidant, typically water ($H_2O$). According to one or more embodiments, selective deposition of a high-κ dielectric layer, such as aluminum oxide, without the need for any separate passivation chemicals or blocking agents can be used to deposit a material on a metal, while limiting deposition on an adjacent dielectric material.

In one or more embodiments, a method of selectively forming a high-K metal oxide dielectric material on a first surface, without forming the high-K metal oxide dielectric material on a second surface is described. The first surface can be a metal with a native oxide, and the second surface can be a dielectric material. In one or more embodiments, the method involves the simultaneous exposure of both surfaces to an organometallic precursor, followed by exposure to an oxidant. In one or more embodiments, the oxidant comprises one or more of oxygen, tert-butyl alcohol, 3-butene -2-ol, 2-methyl-3-butene-2-ol, 2-phenyl-2-propanol, or R—OH where R comprises $CF_3$ or $C_{1-20}$ alkyl, $C_{1-20}$ aryl, $C_{1-20}$ alkenyl, or $C_{1-20}$ alkynyl. With sequential process flow, the organometallic precursor undergoes a reaction with the oxidant on the first surface, while having limited interaction with the second surface.

Unless otherwise indicated, if a surface or layer is referred to as a metal surface or layer herein, it may be a metal surface or a metallic surface. In one or more embodiments, the metal or metallic layer may comprise metal, for example an elemental metal, metal nitride, metal silicide, metal carbide, and/or mixtures thereof. In one or more embodiments, the metal or metallic layer may comprise metal, for example aluminum or aluminum oxide, and one or more of a nitride, a silicide, or a carbide. In some embodiments the metal or metallic layer may comprise surface oxidation, for example a surface layer of native oxide. In some embodiments the metal or metallic material of the metal or metallic layer is electrically conductive with or without surface oxidation.

Figure 2A:
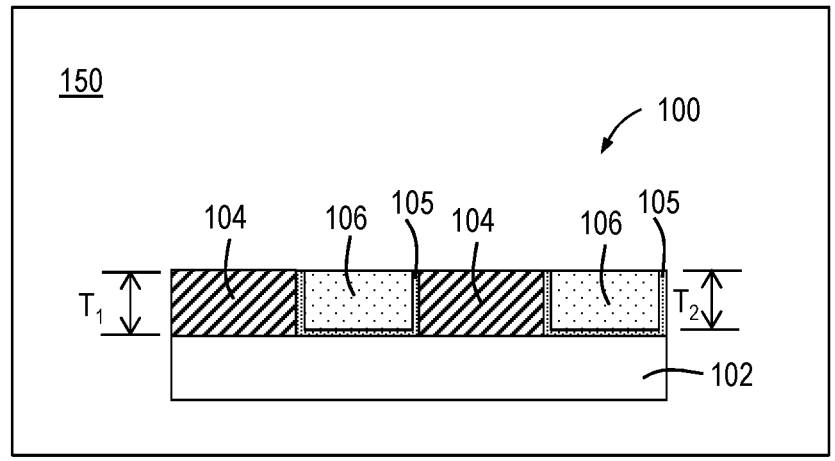
FIG. 2A illustrates a cross-sectional view of a substrate according to one or more embodiments.

FIGS. 2A-4B provide cross-sectional views and top views of a substrate (e.g. wafer) according to one or more embodiments. In one or more embodiments, the substrate 102 may be patterned according to any of the techniques known to those of skill in the art. FIG. 2A is a cross-sectional view 100 of a substrate 102 according to one or more embodiments. FIG. 2B is a top view 110 of a substrate 102 according to one or more embodiments. Referring to FIGS. 2A-2B, in one or more embodiments, a substrate 102 having a metal layer 106 and a dielectric layer 104 is provided and placed in a processing chamber 150. As used in this specification and the appended claims, the term "provided" means that the substrate is made available for processing (e.g., positioned in a processing chamber). The dielectric layer 104 has a thickness $T_1$, and the metal layer 106 has a thickness $T_2$. In one or more embodiments, the metal layer 106 has a thickness $T_2$ in the range of about 1 nm to about 100 nm. In one or more embodiments, the dielectric layer 104 has a thickness $T_1$ of about 1 nm to about 100 nm. In one or more embodiments, the thickness $T_1$ is substantially the same as the thickness $T_2$. As used herein, the term "substantially the same" means that the thickness $T_1$ and the thickness $T_2$ are within 0.5 nm of one another. In other embodiments, $T_1$ and $T_2$ have different thicknesses.

In some embodiments, the metal layer 106 and the dielectric layer 104 may be adjacent to one another. As used herein, the term "adjacent to" refers to the placement of metal layer 106 relative to the dielectric layer 104. The metal layer 106 and the dielectric layer 104 have a common border. In one or more embodiments, an optional barrier/liner material 105 can surround metal layer 106, thus separating metal layer 106 and dielectric layer 104. In one or more embodiments, a barrier/liner material 105 is located between metal layer 106 and dielectric layer 104, or is located between metal layer 106 and substrate 102 and between dielectric layer 104 and substrate 102. In some embodiments, the barrier/liner material 105 may comprise one or more of titanium nitride (TiN), tantalum nitride (TaN), tungsten nitride (WN), titanium (Ti), tungsten (W), tantalum (Ta), and the like.

In one or more embodiments, a surface of the metal layer 106 and the dielectric layer 104 may be patterned according to any of the techniques known to those of skill in the art.

In one or more embodiments, the metal layer 106 comprises or consists essentially of one or more of cobalt (Co), tungsten (W), ruthenium (Ru), copper (Cu), nickel (Ni), manganese (Mn), silver (Ag), gold (Au), platinum (Pt), iron (Fe), molybdenum (Mo), or rhodium (Rh). In one or more embodiments, the metal layer 106 comprises or consists essentially of cobalt or copper.

Figure 2B:
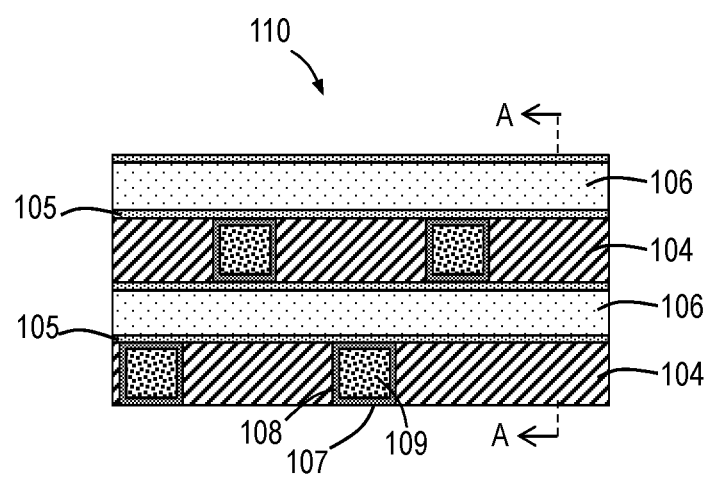
FIG. 2B illustrates a top view of a substrate according to one or more embodiments.

Referring to FIG. 2B, in one or more embodiments, there may be a plurality of features 107 (e.g., vias) on the dielectric layer 104. The plurality of features 107 illustrated include a liner 108 (e.g., a high-k material) and a conductor 109 (e.g., metal). As will be appreciated by one of skill in the art, the plurality of features 107 are not show in FIG. 2A. The cross-section view 100 is taken along line A-A' in FIG. 2B.

Figure 3A:
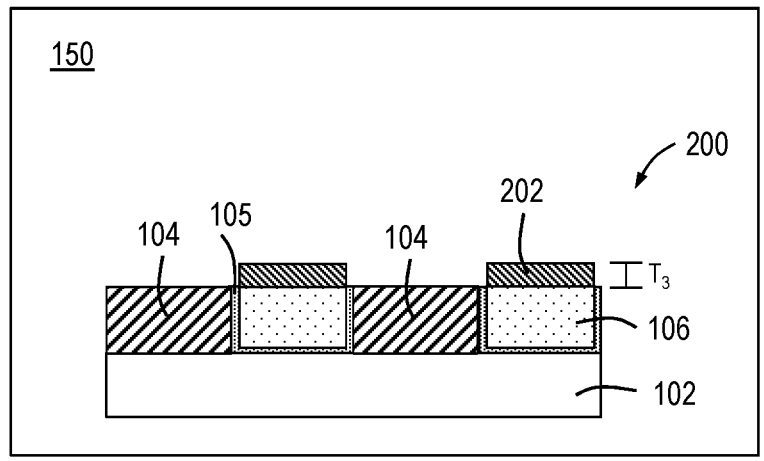
FIG. 3A illustrates a cross-sectional view of a substrate according to one or more embodiments.
Figure 3B:
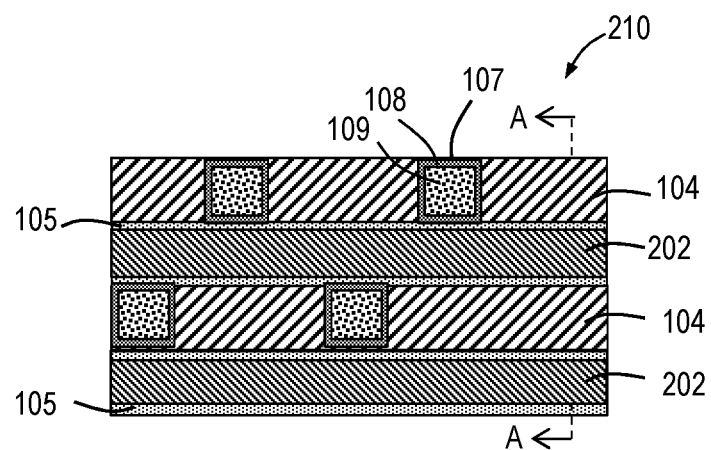
FIG. 3B illustrates a top view of a substrate according to one or more embodiments.

FIG. 3A is a cross-sectional view 200 of a substrate 102 according to one or more embodiments. FIG. 3B is a top view 210 of a substrate 102 according to one or more embodiments. Referring to FIGS. 3A-3B, in one or more embodiments, during a deposition cycle, the substrate 102 is placed in a processing chamber 150 and the metal layer 106 is deposited on the substrate 102 adjacent to the dielectric layer 104. In one or more embodiments, a native oxide of the metal layer 106 is allowed to grow to form a metal oxide layer 202. In other embodiments, the metal layer 106 is selectively oxidized to form the metal oxide layer 202. In still further embodiments, the metal oxide layer 202 is directly deposited by any of the deposition techniques/processes known to those of skill in the art. In one or more embodiments, the metal oxide layer 202 has a thickness $T_3$, which is less than about 5 nm, or less than about 4 nm, or less than about 3 nm, or less than about 2nm, or less than about 1nm. In some embodiments, the thickness $T_3$ of the metal oxide layer 202 is in a range of about 1 nm to about 2 nm.

In one or more embodiments, the metal oxide layer 202 comprises one or more of cobalt oxide (CoO), tungsten oxide (WO), ruthenium oxide (RuO), copper oxide (CuO), nickel oxide (NiO), manganese oxide (MnO), silver oxide (AgO), gold oxide (AuO), platinum oxide (PtO), iron oxide (FeO), molybdenum oxide (MbO), rhodium oxide (RhO). The metal oxide layer 202 may comprise surface oxidation, for example a layer of native metal oxide of the metal layer 106. In some embodiments, the metal oxide layer 202 is non-stoichiometric relative to the ideal molecular formula. For example, in some embodiments, the metal oxide layer 202 includes, but is not limited to, oxides, e.g., cobalt oxide, tungsten oxide, ruthenium oxide, copper oxide, nickel oxide, manganese oxide, silver oxide, gold oxide, platinum oxide, iron oxide, or rhodium oxide.

In one or more embodiments, the metal layer 106 and the metal oxide layer 202 are comprised of the same metal. For example, if the metal layer 106 comprises cobalt (Co), then the metal oxide layer 202 comprises cobalt oxide (CoO).

Figure 4A:
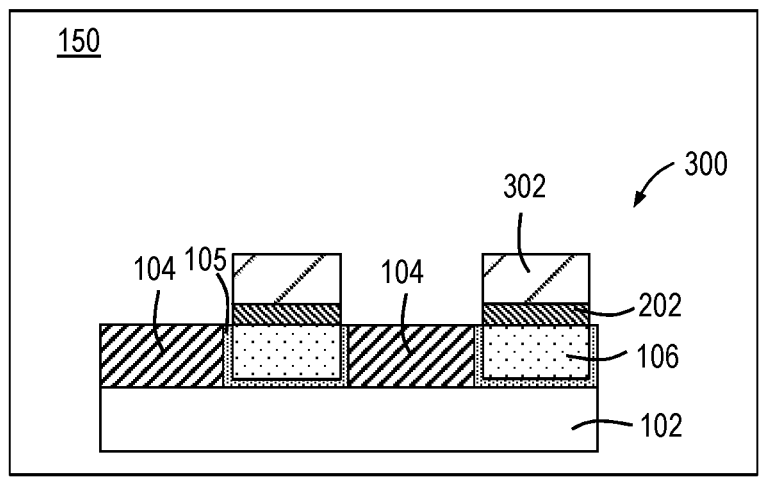
FIG. 4A illustrates a cross-sectional view of a substrate according to one or more embodiments.
Figure 4B:
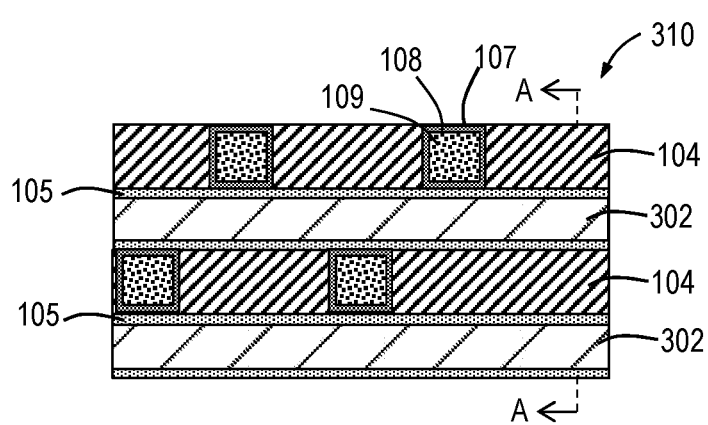
FIG. 4B illustrates a top view of a substrate according to one or more embodiments.

FIG. 4A is a cross-sectional view 300 of a substrate 102 according to one or more embodiments. FIG. 4B is a top view 310 of a substrate 102 according to one or more embodiments. Referring to FIGS. 4A-4B, according to the method of one or more embodiments, the substrate 102 positioned in processing chamber 150 is exposed to an organometallic precursor to deposit a metal oxide film 302 on the metal layer 106 and/or the metal oxide layer 202. In one or more embodiments, the deposition of the metal oxide film 302 does not damage the underlying metal layer 106.

The deposition of the metal oxide film 302 is selective to the metal layer 106 and/or the metal oxide layer 202 relative to the dielectric layer 104. In some embodiments, the metal oxide film 302 deposition is selective to the metal layer 106 relative to growth on the dielectric layer 104 in a ratio greater than or equal to about 5:1, 10:1, 15:1, 20:1, 25:1, 30:1, 35:1, 40:1, 45:1, 50:1, 100:1, 2001:1, 300:1, 400:1, 500:1, 1000:1, 1500:1, 2000:1, 2500:1, 3000:1, 3500:1, 4000:1, 4500:1, 5000:1, or more. In some embodiments, the metal oxide film 302 deposition is selective to the metal oxide layer 202 relative to growth on the dielectric layer 104 in a ratio greater than or equal to about 5:1, 10:1, 15:1, 20:1, 25:1, 30:1, 35:1, 40:1, 45:1, 50:1, 100:1, 2001:1, 300:1, 400:1, 500:1, 1000:1, 1500:1, 2000:1, 2500:1, 3000:1, 3500:1, 4000:1, 4500:1, 5000:1, or more.

In one or more embodiments, the organometallic precursor comprises a large diameter aluminum precursor. In one or more embodiments, the organometallic precursor comprises one or more of tri-tertbutylaluminum (TTBA), bis(2-methyl-2-propanyl)-(2-methyl-1-propanyl)aluminum), (2-methyl-2-propanyl)bis(2-methyl-1-propanyl)aluminum), tris(2-methyl-1-propanyl)aluminum), triethyl aluminum (TEA), tri(neopentyl) aluminum, or aluminum isopropoxide. In an embodiment, the organometallic precursor comprises one or more of tri-tertbutylaluminum (TTBA), bis(2-methyl -2-propanyl)-(2-methyl-1-propanyl)aluminum), (2-methyl-2-propanyl)bis(2-methyl-1-propanyl)aluminum), tris(2-methyl-1-propanyl)aluminum). In an embodiment, the organometallic precursor comprises an aluminum precursor. In one or more embodiments, the aluminum precursor comprises tr-tertybutylaluminum (TTBA) or one or more isomers thereof.

As used herein, tri-tertbutylaluminum refers to compositions comprising one or more isomers of tri-tertbutylaluminum (TTBA). Tri-tertbutyl aluminum (TTBA) has the formula $C_{12}H_{27}Al$ (IUPAC name: tris(2-methyl-2-propanyl) aluminum), and can be described as $Al((tert-Bu)_3)$. As recognized by those skilled in the art, TTBA has been found to spontaneously isomerize under certain conditions and, therefore, can be unstable during storage and use. For example, when stored for long periods (e.g., one year) at room temperature, or when stored for shorter periods (e.g., days or weeks) at higher temperatures (e.g., when subjected to heat over 60° C.), a TTBA composition may undergo isomerization such that the nature of the composition changes over time. TTBA degrades over time into a mixture of TTBA and one or more of its three isomers. The isomerization of TTBA into its three isomers is illustrated in Scheme I:

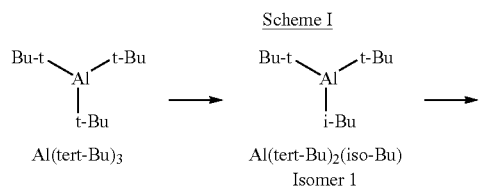

Scheme I $Al(tert-Bu)_3$ → $Al(tert-Bu)_2(iso-Bu)$
Isomer 1

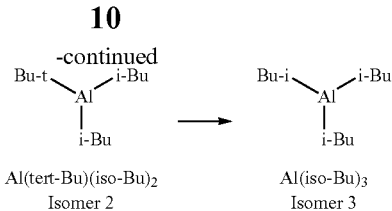

$Al(tert-Bu)(iso-Bu)_2$ → $Al(iso-Bu)_3$
Isomer 2     Isomer 3

This isomerization can lead to variability over time in the quality of thin films deposited using a TTBA source.

As illustrated in Scheme I, TTBA has at least three isomers, referred to herein as Isomer 1, Isomer 2, and Isomer 3. Isomer 1 (IUPAC name: bis(2-methyl-2-propanyl)-(2-methyl-1-propanyl)aluminum) has the formula $Al(tert-Bu)_2$ (iso-Bu), Isomer 2 (IUPAC name: (2-methyl-2-propanyl)bis (2-methyl-1-propanyl)aluminum) has the formula $Al(tert-Bu)(iso-Bu)_2$, and Isomer 3 (IUPAC name: tris(2-methyl-1-propanyl)aluminum) has the formula $Al(iso-Bu)_3$. Without intending to be bound by theory, it is believed that TTBA can isomerize to Isomer 1 at room temperature or at higher temperatures (e.g., 60° C.) and that isomerization of TTBA to Isomer 1 occurs relatively easily, whereas isomerization to Isomer 2 and Isomer 3 is more difficult. For example, Isomer 1 is relatively stable at ≤50° C., and at ≤50° C. Isomer 1 does not significantly further isomerize into Isomer 2 and Isomer 3. However, Isomer 1 can isomerize to Isomer 2 at least at about 80° C.

Accordingly, a composition comprising a larger percentage of Isomer 1 can be more stable over time at typical temperatures used for storage and in vapor deposition reactors than compositions comprising a greater percentage of TTBA. In one or more embodiments, an organometallic precursor composition comprises a mixture of TTBA and Isomer 1. In some embodiments, Isomer 1 makes up at least 50% of the TTBA precursor composition. In some embodiments Isomer 1 makes up at least 70% of the TTBA precursor composition. In some embodiments, Isomer 1 comprises at least 70%, including at least 75%, at least 80%, at least 85%, at least 90%, at least 91%, at least 92%, at least 93%, at least 94%, or at least 95% of the TTBA precursor composition. As used herein, the recited percentage composition of the precursors is determined by percentage mass.

In one or more embodiments, the precursor composition comprises greater than 95% TTBA, including greater than 96%, greater than 97%, greater than 98%, or greater than 99%.

In one or more embodiments, the TTBA precursor composition does not comprise Isomer 2. In one or more embodiments, the TTBA precursor composition does not comprise Isomer 3. In other embodiments the TTBA precursor composition may comprise at most about 5% Isomer 3.

In one or more embodiments an organometallic precursor composition comprising Isomer 1 does not comprise TTBA. In some such embodiments, an Isomer 1 precursor composition is provided in which Isomer 1 makes up at least 50% of the precursor composition, including at least 55%, at least 60%, at least 65%, at least 70%, at least 75%, at least 80%, at least 85%, at least 90%, at least 91%, at least 92%, at least 93%, at least 94%, or at least 95% of the precursor composition.

In one or more embodiments the Isomer 1 precursor composition does not comprise Isomer 2. In one or more embodiments the Isomer 1 precursor composition does not comprise Isomer 3. In one or more embodiments the Isomer 1 precursor composition may comprise at most about 5% Isomer 3.

In one or more embodiments, a TTBA precursor composition may comprise Isomers 2 and/or 3 in addition to TTBA and Isomer 1. Thus, in some embodiments, a TTBA precursor composition comprises TTBA, Isomer 1, and may additionally comprise Isomer 2. For example, as disclosed herein an organometallic precursor composition may comprise TTBA and at least 20% of a combination of Isomer 1 and Isomer 2. In some embodiments, the TTBA precursor composition comprises TTBA, Isomer 1, and may additionally comprise Isomers 2 and 3. In some embodiments, the total amount of Isomer 2 and Isomer 3 in the composition is less than about 30%, less than about 20%, less than about 10%, less than about 5%, or less than about 1%.

In one or more embodiments, an organometallic precursor composition is provided comprising at least 50% Isomer 2, at least 70% Isomer 2, at least 80% Isomer 2, at least 90% Isomer 2, at least 95% Isomer 2, or at least 99% Isomer 2.

In one or more embodiments, a TTBA precursor composition comprises a mixture of TTBA and Isomer 2. In some embodiments, Isomer 2 makes up at least 50% of the TTBA precursor composition, including at least 55%, at least 60%, at least 65%, at least 70%, at least 75%, at least 80%, at least 85%, at least 90%, at least 91%, at least 92%, at least 93%, at least 94%, or at least 95% of the TTBA precursor composition.

In one or more embodiments a precursor composition comprising Isomer 2 does not comprise TTBA. In some such embodiments, an Isomer 2 precursor composition is provided in which Isomer 2 makes up at least 50% of the precursor composition, including at least 55%, at least 60%, at least 65%, at least 70%, at least 75%, at least 80%, at least 85%, at least 90%, at least 91%, at least 92%, at least 93%, at least 94%, or at least 95% of the precursor composition. In one or more embodiments the Isomer 2 precursor composition does not comprise Isomer 1. In other embodiments the Isomer 2 precursor composition does not comprise Isomer 3. In still further embodiments the Isomer 2 precursor composition may comprise at most about 5% Isomer 3.

In one or more embodiments, a TTBA precursor composition may comprise Isomers 1 and/or 3 in addition to TTBA and Isomer 2. Thus, in some embodiments, a TTBA precursor composition comprises TTBA, Isomer 1 and may additionally comprise Isomer 2. In some embodiments, the TTBA precursor composition comprises TTBA Isomer 2 and may additionally comprise Isomers 1 and 3. In some embodiments, the total amount of Isomer I and Isomer 3 in the composition is less than about 30%, less than about 20%, less than about 10%, less than about 5%, or less than about 1%.

In one or more embodiments, a precursor composition may comprise at least 20% of a combination of Isomer 1 and Isomer 2. In one or more embodiments the precursor composition may comprise TTBA and at least 20% of a combination of Isomer 1 and Isomer 2. In one or more embodiments, a precursor composition may comprise at least 50% of a combination of Isomer 1 and Isomer 2. In one or more embodiments a TTBA precursor may comprise TTBA and at least 50% of a combination of Isomer 1 and Isomer 2. In one or more embodiments, a precursor composition may comprise at least 80% of a combination of Isomer 1 and Isomer 2. In one or more embodiments a TTBA precursor may comprise TTBA and at least 80% of a combination of Isomer 1 and Isomer 2. In one or more embodiments, a TTBA precursor composition comprises a combination of Isomer 1 and Isomer 2 and does not comprise Isomer 3.

In one or more embodiments, an organometallic precursor composition comprises a combination of Isomer 1 and Isomer 2 and a trace percentage of Isomer 3. For example, a precursor composition may comprise a combination of Isomer 1 and Isomer 2 and at most 5% Isomer 3. In one or more embodiments, a TTBA precursor composition comprises a combination of Isomer 1 and Isomer 2 and a trace percentage of TTBA. For example, a TTBA precursor composition may comprise a combination of Isomer 1 and Isomer 2 and at most 5% TTBA. In one or more embodiments an organometallic precursor composition may comprise a combination of Isomer 1 and Isomer 2, as described above, in addition to at most 5% TTBA and at most 5% Isomer 3.

As used herein, the term "Isomer 1 precursor composition" is used to refer to an organometallic precursor composition comprising at least 50% Isomer 1. As discussed above, in some embodiments, an Isomer 1 precursor composition may contain more than 50% of Isomer 1, for example at least 55, 60, 65, 70, 75, 80, 85, 90, 91, 92, 93, 94, 95, 98, 99 or 99.5% of Isomer 1.

In one or more embodiments, an Isomer 1 precursor composition may comprise one or more additional components, for example TTBA, Isomer 2, Isomer 3 and/or contaminants. In some embodiments, the total amount of contaminants or minor components is less than about 1% of the precursor composition. In one or more embodiments an Isomer 1 precursor composition contains at least a trace amount of TTBA, up to at most 5%. In one or more embodiments an Isomer 1 precursor composition contains at least a trace amount of Isomer 3, up to at most 5%.

As used herein, the term "Isomer 2 precursor composition" is used to refer to a precursor composition comprising at least 50% Isomer 2. As discussed above, in some embodiments, an Isomer 1 precursor composition may contain more than 50% of Isomer 2, for example at least 55, 60, 65, 70, 75, 80, 85, 90, 91, 92, 93, 94, 95, 98, 99 or 99.5% of Isomer 2.

In one or more embodiments, an Isomer 2 precursor composition may comprise one or more additional components, for example TTBA, Isomer 1, Isomer 3 and/or contaminants. In one or more embodiments, the total amount of contaminants or minor components is less than about 1% of the organometallic precursor composition. In one or more embodiments an Isomer 2 precursor composition contains at least a trace amount of TTBA, up to at most 5%. In one or more embodiments an Isomer 2 precursor composition contains at least a trace amount of Isomer 3, up to at most 5%.

As used herein, the term "Isomer 1 and 2 precursor composition" is used to refer to a precursor composition comprising at least 20% of a combination of Isomer 1 and Isomer 2. In one or more embodiments, an Isomer 1 and 2 precursor composition may contain more than about 20% of a combination of Isomer 1 and 2, more than about 30% of a combination of Isomer 1 and Isomer 2, more than about 40% of a combination of Isomer 1 and 2, or even more than about 50% of a combination of Isomer 1 and Isomer 2, for example at least 55, 60, 65, 70, 75, 80, 85, 90, 91, 92, 93, 94, 95, 98, 99 or 99.5% of a combination of Isomer 1 and Isomer 2.

In one or more embodiments, an Isomer 1 and 2 precursor composition may comprise one or more additional components, for example TTBA Isomer 3 and/or contaminants. In one or more embodiments, the total amount of contaminants or minor components is less than about 1% of the precursor composition. In one or more embodiments an Isomer 1 and 2 precursor composition contains at least a trace amount of TTBA, up to at most 5%. In one or more embodiments an Isomer 1 and 2 precursor composition contains at least a trace amount of Isomer 3, up to at most 5%.

In one or more embodiments, an Isomer 1 precursor composition can be prepared by heating a composition consisting essentially of TTBA until a desired amount of Isomer 1 has fanned in the composition. In one or more embodiments, an Isomer 2 precursor composition can be prepared by heating a composition consisting essentially of TTBA until a desired amount of Isomer 2 has formed in the composition. In one or more embodiments, an Isomer 1 and 2 precursor composition can be prepared by heating a composition consisting essentially of TTBA until a desired amount of Isomer 1 and 2 has formed in the composition.

As recognized by those skilled in the art, other methods of obtaining the isomers of TTBA are possible and are included within the scope of the disclosure.

In one or more embodiments, the metal oxide film 302 comprises one or more of $HfO_2$, $ZrO_2$, VO, $TiO_2$, $SnO_2$, $Al_2O_3$, or ZnO. In a specific embodiment, the metal oxide film 302 comprises $Al_2O_3$. In one or more embodiments, the metal oxide film 302 comprises oxygen atoms and aluminum atoms. In a specific embodiment, the metal oxide film 302 comprises aluminum oxide. While the term "aluminum oxide" may be used to describe the metal oxide film 302, the skilled artisan will recognize that the disclosure is not restricted to a particular stoichiometry. For example, the terms "aluminum oxide" and "alumina" may both be used to describe a material having aluminum and oxygen atoms in any suitable stoichiometric ratio. The same is true for the other materials listed in this disclosure, e.g. silicon nitride, silicon oxynitride, tungsten oxide, zirconium oxide, and the like.

Without intending to be bound by theory, the metal layer 106 can comprise any metal wherein the energy of formation of the metal oxide layer 202 is less negative than the energy of formation of the metal oxide film 302, such that the metal oxide film 302 is more thermodynamically stable.

In one or more embodiments, exposing the substrate 102 to an organometallic precursor to deposit a metal oxide film 302 involves an atomic layer deposition (ALD), which employs sequential, self-limiting surface reactions to form the metal oxide film 302. In one or more embodiments, an organometallic precursor is introduced into a processing chamber, where it partially reacts with the surface of the substrate (e.g. wafer). Then, an oxidant is introduced to oxidize the partially reacted precursor to a metal oxide film. In one or more embodiments, exposing the substrate 102 to an organometallic precursor to deposit a metal oxide film 302 involves introducing the organometallic precursor into a processing chamber, where the organometallic precursor reacts with the surface of the metal oxide layer 202 to form the metal oxide film 302.

In one or more embodiments, reaction of a large diameter aluminum precursor with an oxidant (e.g. water) advantageously leads to the selectivity of formation of the metal oxide film 302 on the metal layer 106 and/or metal oxide layer 202 relative to the formation on the dielectric layer 104. In one or more embodiments, the dielectric layer 104 is substantially free of the metal oxide that forms the metal oxide film 302. In a specific embodiment, the dielectric layer 104 is substantially free of aluminum oxide, the aluminum oxide forming an aluminum oxide monolayer on the metal layer 106 and/or metal oxide layer 202. As used herein, the term "substantially free" means that there is less than 5%, including less than 4%, less than 3%, less than 2%, less than 1%, and less than 0.5% of the metal oxide that forms the metal oxide film 302 present on the dielectric layer 104. In one or more specific embodiments, the metal oxide film 302 is an aluminum oxide monolayer, and the dielectric layer 104 is substantially free of aluminum oxide. Without intending to be bound by theory, it is thought that there is a synergistic relationship between the organometallic precursor and the oxidant that results in the observed selectivity.

Reaction conditions, including temperature, pressure, processing time, and the substrate surface(s) can be selected to obtain the desired level of selective deposition of the metal oxide film 302 on the metal layer 106 and/or metal oxide layer 202 relative to the dielectric layer 104.

In one or more embodiments, the substrate 102 is exposed to the organometallic precursor at a temperature in a range of about 100° C. to about 500° C., including in a range of about 100° C. to about 400° C., about 100° C. to about 375° C., and about 100° C. to about 325° C., about 200° C. to about 375° C., about 200° C. to about 250° C., and about 250° C. to about 400° C. In one or more embodiments, the organometallic precursor is a stable precursor, so the substrate can be at higher temperature, likely accelerating oxide diffusion/growth. In other embodiments, for example when the oxidant comprises water, higher temperature may cause undesirable damage to the metal layer 106, and, thus, a lower temperature is necessary. In one or more embodiments, higher process temperature leads to higher selectivity. Without intending to be bound by theory, it is thought that increasing the process temperature will decrease the adsorption rate due to the amount of physisorbed molecules on the surface.

In one or more embodiments, the substrate 102 is exposed to the organometallic precursor at a pressure in a range of about 0.5 Torr to about 30 Torr, including about 0.5 Torr to about 20 Torr, about 0.5 Torr to about 10 Torr, including about 0.5 Torr, about 1 Torr, about 1.5 Torr, about 2.0 Torr, about 2.5 Torr, about 3.0 Torr, about 3.5 Torr, about 4.0 Torr, about 4.5 Torr, about 5.0 Torr, about 5.5 Torr, about 6.0 Torr, about 6.5 Torr, about 7.0 Torr, about 7.5 Torr, about 8.0 Torr, about 8.5 Torr, about 9.0 Torr, about 9.5 Torr, about 10 Torr, about 12 Torr, about 14 Torr, about 15 Torr, about 20 Torr, about 22 Torr, about 25 Torr, about 27 Torr, and about 30 Torr. Without intending to be bound by theory, it is thought that decreasing the process pressure will help with blocking.

In one or more embodiments, the substrate 102 is exposed to the organometallic precursor for a period of time in the range of about 0.1 seconds to about 10 seconds, including about 0.1 seconds, about 0.5 seconds, about 1.0 seconds, about 1.5 seconds, about 2.0 seconds, about 2.5 seconds, about 3.0 seconds, about 3.5 seconds, about 4.0 seconds, about 4.5 seconds, about 5.0 seconds, about 5.5 seconds, about 6.0 seconds, about 6.5 seconds, about 7.0 seconds, about 7.5 seconds, about 8.0 seconds, about 8.5 seconds, about 9.0 seconds, about 9.5 seconds, and about 10.0 seconds.

In one or more embodiments, the substrate 102 is exposed to the oxidant for a period of time in the range of about 0.1 seconds to about 30 seconds, including about 0.1 seconds, about 0.5 seconds, about 1.0 seconds, about 2.0 seconds, about 3.0 seconds, about 4.0 seconds, about 5.0 seconds, about 6.0 seconds, about 7.0 seconds, about 8.0 seconds, about 9.0 seconds, about 10.0 seconds, about 11.0 seconds, about 12.0 seconds, about 13.0 seconds, about 14.0 seconds, about 15.0 seconds, about 16.0 seconds, about 17.0 seconds, about 18.0 seconds, about 19.0 seconds, about 20.0 seconds, about 21.0 seconds, about 22.0 seconds, about 23.0 seconds, about 24.0 seconds, about 25.0 seconds, about 26.0 seconds, about 27.0 seconds, about 28.0 seconds, about 29.0 seconds, and about 30.0 seconds.

In one or more embodiments, the deposition process is an atomic layer deposition (ALD) type process. In some embodiments, the deposition process is a thermal ALD process. In one or more embodiments, the processing chamber 150 is purged of the organometallic precursor and/or the oxidant. In one or more embodiments, the purge time can be in a range of about 0.1 seconds to about 20 seconds, including about 0.1 seconds, about 0.5 seconds, about 1.0 seconds, about 1.5 seconds, about 2.0 seconds, about 2.5 seconds, about 3.0 seconds, about 3.5 seconds, about 4.0 seconds, about 4.5 seconds, about 5.0 seconds, about 5.5 seconds, about 6.0 seconds, about 6.5 seconds, about 7.0 seconds, about 7.5 seconds, about 8.0 seconds, about 8.5 seconds, about 9.0 seconds, about 9.5 seconds, about 10.0 seconds, about 11.0 seconds, about 12.0 seconds, about 13.0 seconds, about 14.0 seconds, about 15.0 seconds, about 16.0 seconds, about 17.0 seconds, about 18.0 seconds, about 19.0 seconds, and about 20.0 seconds, In some embodiments, the deposition process is a vapor deposition process in which a substrate is contacted with a vapor phase of the organometallic precursor. In one or more embodiments, the process is a chemical vapor deposition (CVD) process, and the purge time is zero.

One or more embodiments are directed to a method of depositing a film. In one or more embodiments, the method comprises providing a substrate 102 having a metal layer 106 and a dielectric layer 104. The substrate 102 is exposed to an organometallic precursor in a processing chamber 150 to deposit a metal monolayer (not shown) on the metal layer 106. The processing chamber 150 is purged of the organometallic precursor. The substrate 102 is exposed to a reactant gas consisting essentially of molecular oxygen to react with the metal monolayer to form a metal oxide film 302 on the metal layer 106. The processing chamber 150 is then purged of reactant gas (i.e., molecular oxygen).

The oxidant may comprise one or more of oxygen, tert-butyl alcohol, 3-butene -2-ol, 2-methyl-3-butene-2-ol, 2-phenyl-2-propanol, or R—OH where R comprises $CF_3$ or $C_{1-20}$ alkyl, $C_{1-20}$ aryl, $C_{1-20}$ alkenyl, or $C_{1-20}$ alkynyl.

As used herein, "alkyl," or "alk" includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloalkylalkyloxy, amino, hydroxy, hydroxyalkyl, acyl, heteroaryl, heteroaryloxy, heteroarylalkyl, heteroarylalkoxy, aryloxyalkyl, alkylthio, arylalkylthio, aryloxyaryl, alkylamido, alkanoylamino, arylcarbonylamino, nitro, cyano, thiol, haloalkyl, trihaloalkyl, and/or alkylthio, and the like. In one or more embodiments, R is independently selected from $C_{1-20}$ alkyl. In other embodiments, R is from $C_{1-12}$ alkyl. In one or more embodiments, R—OH comprises one or more of isopropyl alcohol, isobutanol, or tert-butanol.

As used herein, the term "alkene" or "alkenyl" or "lower alkenyl" refers to straight or branched chain radicals of 2 to 20 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein.

As used herein, the term "alkynyl" or "lower alkynyl" refers to straight or branched chain radicals of 2 to 20 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

The term "halogen" or "halo" as used herein alone or as part of another group refers to chlorine, bromine, fluorine, and iodine as well as $CF_3$.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

In one or more embodiments, the dielectric layer comprises one or more of oxides, carbon doped oxides, porous silicon dioxide ($SiO_2$), silicon oxide (SiO), silicon nitride (SiN), carbides, oxycarbides, nitrides, oxynitrides, oxycarbonitrides, polymers, phosphosilicate glass, fluorosilicate (SiOF) glass, or organosilicate glass (SiOCH).

In one or more embodiments, the metal layer 106 comprises one or more of cobalt (Co), tungsten (W), ruthenium (Ru), copper (Cu), nickel (Ni), manganese (Mn), silver (Ag), gold (Au), platinum (Pt), iron (Fe), molybdenum (Mo), or rhodium (Rh).

In one or more embodiments, purging the processing chamber comprises flowing a purge gas over the substrate. The purge gas may be selected from one or more of argon (Ar), nitrogen ($N_2$), helium (He), hydrogen ($H_2$), or a hydrogen ($H_2$)-containing gas.

The method of one or more embodiments may be repeated more than once, providing a metal oxide film (e.g. aluminum oxide film) having a thickness of about 0.5 to about 10 nm, including about 0.5 nm, about 0.6 nm, about 0.7 nm, about 0.8 nm, about 0.9 nm, about 1.0 nm, about 1.5 nm, about 2.0 nm, about 2.5 nm, about 3.0 nm, about 3.5 nm, about 4.0 nm, about 4.5 nm, about 5.0 nm, about 5.5 nm, about 6.0 nm, about 6.5 nm, about 7.0 nm, about 7.5 nm, about 8.0 nm, about 8.5 nm, about 9.0 nm, about 9.5 nm, or about 10.0 nm. When the method of one or more embodiments is repeated one or more times, a metal oxide film (e.g. aluminum oxide film) is formed, the metal oxide film having less than or equal to about 150 total monolayers.

The method of one or more embodiments may be repeated more than once, providing a metal oxide film (e.g. aluminum oxide film) having a thickness of about 2 nm to about 10 nm, including about 2 nm, about 2.5 nm, about 3.0 nm, about 3.5 nm, about 4.0 nm, about 4.5 nm, about 5.0 nm, about 5.5 nm, about 6.0 nm, about 6.5 nm, about 7.0 nm, about 7.5 nm, about 8.0 nm, about 8.5 nm, about 9.0 nm, about 9.5 nm, or about 10.0 nm. When the method of one or more embodiments is repeated one or more times, a metal oxide film (e.g. aluminum oxide film) is formed, the metal oxide film having less than or equal to about 150 total monolayers.

One or more embodiments provide an electronic device. The electronic device comprises a first metal oxide film selectively deposited on a metal layer relative to a dielectric layer, the dielectric layer substantially free of the first metal oxide. In one or more embodiments, the first metal comprises aluminum. Thus, in one or more embodiments, the first metal oxide comprises aluminum oxide. In one or more embodiments, the first metal comprises aluminum, and the first metal oxide comprises aluminum oxide.

The metal layer comprises one or more of cobalt (Co), tungsten (W), ruthenium (Ru), copper (Cu), nickel (Ni), manganese (Mn), silver (Ag), gold (Au), platinum (Pt), iron (Fe), molybdenum (Mo), or rhodium (Rh). The dielectric layer comprises one or more of oxides, carbon doped oxides, porous silicon dioxide ($SiO_2$), silicon oxide (SiO), silicon nitride (SiN), carbides, oxycarbides, nitrides, oxynitrides, oxycarbonitrides, polymers, phosphosilicate glass, fluorosilicate (SiOF) glass, or organosilicate glass (SiOCH). In one or more embodiments, the electronic device further comprises a second metal oxide layer between the metal layer and first metal oxide monolayer. The second metal oxide layer may be a native oxide of the metal layer, or the second metal oxide layer may be formed by selectively oxidizing the metal layer, or the second metal oxide layer may be selectively deposited on the metal layer. In one or more embodiments, the second metal oxide layer is formed by selective oxidation of the metal layer.

One or more specific embodiments provide a method for depositing a thin film of aluminum oxide. The method comprises selectively forming an aluminum oxide film in a process cycle comprising sequential exposure of a substrate having a metal layer adjacent to a dielectric layer to an aluminum precursor (e.g. tri-tertbutylaluminum (TTBA) and/or isomers thereof), purge gas, oxidant, and purge gas. The process cycle may be repeated to form an aluminum oxide film on the metal layer, the aluminum oxide film having a thickness of about 2 nm to about 10 nm, and the dielectric layer substantially free of aluminum oxide.

In one or more embodiments, self-assembled monolayers (SAMs) may not be able to block ALD deposition of a metal oxide film when the metal oxide film is deposited at a thickness of greater than about 3 nm on a substrate. In one or more embodiments, thinner metal oxide films result in improved blocking.

According to one or more embodiments, the substrate is subjected to processing prior to and/or after forming the contact. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Three well-known cluster tools which may be adapted for the present disclosure are the Centura®, the Endura®, and the Producer®, all of which are available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Figure 5:
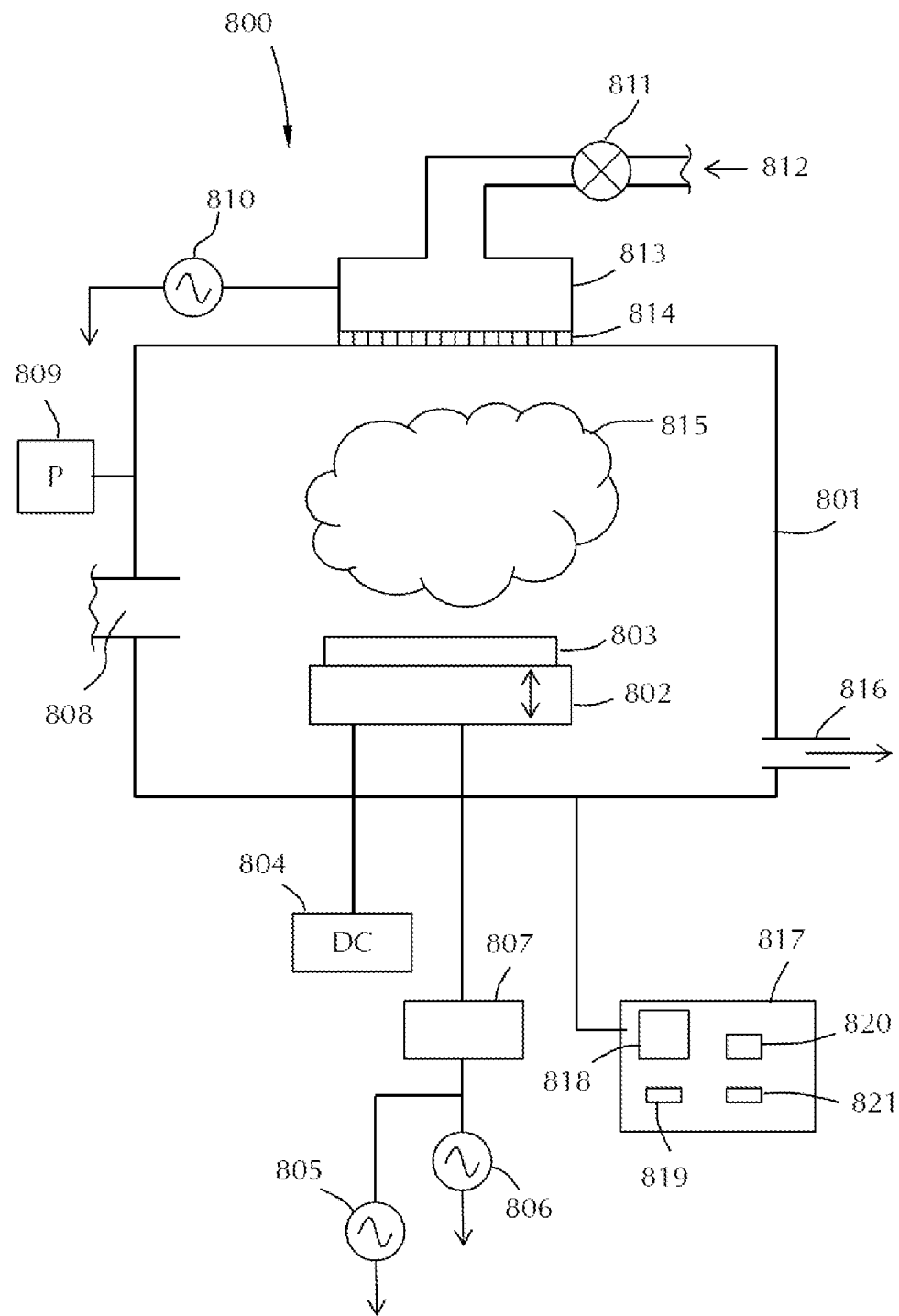
FIG. 5 is a block diagram of a process chamber in accordance with one or more embodiments of the disclosure.

FIG. 5 shows a block diagram of a plasma system 800 to perform at least some of the method of one or more embodiments. The plasma system 800 illustrated has a processing chamber 801. A movable pedestal 802 to hold a substrate 803 that has been positioned in processing chamber 801. Pedestal 802 can comprise an electrostatic chuck ("ESC"), a DC electrode embedded into the ESC, and a cooling/heating base. In an embodiment, pedestal 802 acts as a moving cathode. In an embodiment, the ESC comprises an $Al_2O_3$ material, $Y_2O_3$, or other ceramic materials known to one of ordinary skill of electronic device manufacturing. A DC power supply 804 can be connected to the DC electrode of the pedestal 802. In some embodiments, the pedestal 802 includes a heater (not shown) that is capable of raising the temperature of the substrate to the first temperature. While an electrostatic chuck is illustrated as the pedestal 802, those skilled in the art will understand that this is merely exemplary and other pedestal types are within the scope of the disclosure.

In one or more embodiments, in order to protect self-assembled monolayer (SAM) deposition, the metal oxide film is typically deposited utilizing a thermal deposition process. In such instances, a plasma and a heater are unnecessary. While a plasma and a heater are illustrated in FIG. 5, those skilled in the art will understand that this is merely exemplary and may not be required for the deposition methods of one or more embodiments.

As shown in FIG. 5, a substrate 803 can be loaded through an opening 808 and placed on the pedestal 802. Plasma system 800 comprises an inlet to input one or more process gases 812 through a mass flow controller 811 to a plasma source 813. A plasma source 813 comprising a showerhead 814 is coupled to the processing chamber 801 to receive one or more process gases 812 to generate plasma. Plasma source 813 is coupled to a RF source power 810. Plasma source 813 through showerhead 814 generates a plasma 815 in processing chamber 801 from one or more process gases 812 using a high frequency electric field. Plasma 815 comprises plasma particles, such as ions, electrons, radicals, or any combination thereof. In an embodiment, power source 810 supplies power from about 50 W to about 3000 W at a frequency from about 400 kHz to about 162 MHz to generate plasma 815.

A plasma bias power 805 is coupled to the pedestal 802 (e.g., cathode) via a RF match 807 to energize the plasma. In an embodiment, the plasma bias power 805 provides a bias power that is not greater than 1000 W at a frequency between about 2 MHz to 60 MHz, and in a particular embodiment at about 13 MHz. A plasma bias power 806 may also be provided, for example, to provide another bias power that is not greater than 1000 W at a frequency from about 400 kHz to about 60 MHz, and in a particular embodiment, at about 60 MHz. Plasma bias power 806 and plasma bias power 805 are connected lo RF match 807 to provide a dual frequency bias power. In an embodiment, a total bias power applied to the pedestal 802 is from about 10 W to about 3000 W.

As shown in FIG. 5, a pressure control system 809 provides a pressure to processing chamber 801. The chamber 801 has one or more exhaust outlets 816 to evacuate volatile products produced during processing in the chamber. In an embodiment, the plasma system 800 is an inductively coupled plasma (ICP) system. In an embodiment, the plasma system 800 is a capacitively coupled plasma (CCP) system.

In some embodiments, a control system 817 is coupled to the processing chamber 801. The control system 817 comprises a processor 818, a temperature controller 819 coupled to the processor 818, a memory 820 coupled to the processor 818, and input/output devices 821 coupled to the processor 818. The memory 820 can include one or more of transitory memory (e.g., random access memory) and non-transitory memory (e.g., storage).

In one embodiment, the processor 818 has a configuration to control one or more of: exposing a substrate in the processing chamber to an aluminum precursor; purging of a substrate in the processing chamber, exposing a substrate in the processing chamber to an oxidant, or forming a thin film comprising less than or equal to about 150 monolayers of aluminum oxide on a substrate.

The control system 817 can be configured to perform at least some of the methods as described herein and may be either software or hardware or a combination of both. The plasma system 800 may be any type of high performance processing plasma systems known in the art, such as but not limited to an etcher, a cleaner, a furnace, or any other plasma system to manufacture electronic devices.

Figure 6:
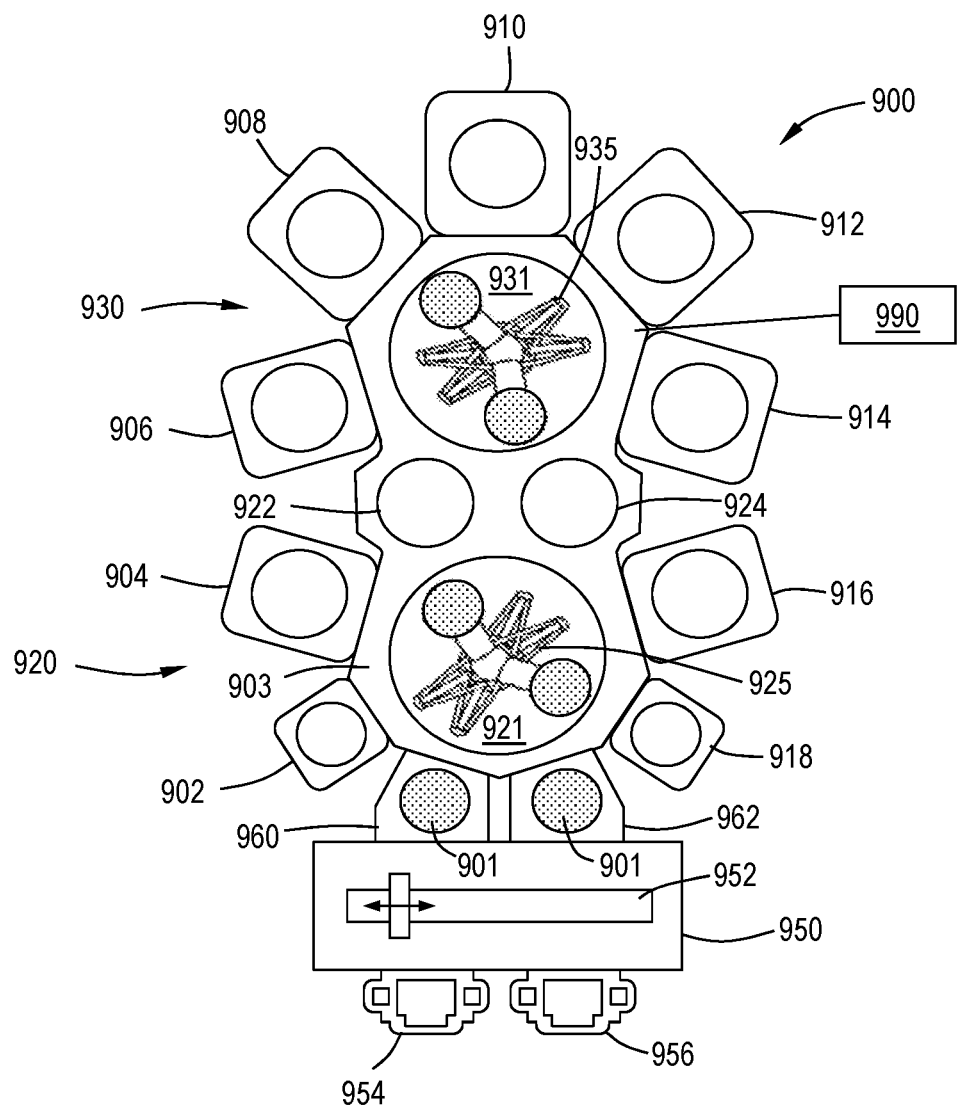
FIG. 6 a schematic view of a cluster tool in accordance with one or more embodiments of the disclosure.

Some embodiments of the disclosure are directed to cluster tools 900, as shown in FIG. 6. The cluster tool 900 includes at least one central transfer station with a plurality of sides. A robot is positioned within the central transfer station and is configured to move a robot blade to each of the plurality of sides.

FIG. 6 shows a schematic diagram of an illustrative multiple chamber semiconductor processing tool, also referred to as a cluster tool or multi-cluster tool. The cluster tool 900 comprises a plurality of processing chambers 902, 904, 906, 908, 910, 912, 914, 916, and 918. The various processing chambers can be any suitable chamber including, but not limited to, a preclean chamber, a buffer chamber, transfer space(s), a wafer orienter/degas chamber, a cryo cooling chamber, and a transfer chamber. The particular arrangement of process chambers and components can be varied depending on the cluster tool and should not be taken as limiting the scope of the disclosure.

In the embodiment shown in FIG. 6, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

An aluminum oxide film was deposited using atomic layer deposition (ALD) techniques. A substrate was exposed to alternating pulses of tri-tertiarybutylaluminum (TTBA) and/or isomers thereof and water with purges in between each alternating pulse. The selectively was determined under reaction with self-assembled monolayers (SAMs).

Example 2

Comparative

An aluminum oxide film was deposited using atomic layer deposition (ALD) techniques. A substrate was exposed to alternating pulses of trimethyl aluminum (TMA) and water with purges in between each alternating pulse. The selectively was determined under reaction with self-assembled monolayers (SAMs).

Results: The results show that precursors' diameter size experience differently on reacting with SAM molecules. The aluminum oxide films have similar properties, but the different precursors produce different selectivity. Aluminum oxide film formed by TMA and water (Example 2) process has worse blocking than the aluminum oxide film formed by tri-tertbutylaluminum (and/or isomers thereof) and water. Because the diameter of the TMA precursor molecules are smaller than the diameter of the tri-tertbutylaluminum molecules, the TMA is more easily physically adsorbed on SAM. The aluminum oxide film produced from tri-tertbutylaluminum and water (Example 1) results in a higher/enhanced blocking percentage (99.7%) versus the aluminum oxide film produced from TMA and water (Example 2, 44.5%).

Example 3

A patterned wafer having a dielectric film and a metal film thereon were provided. The patterned wafer was first exposed to self-assembled monolayers (SAMs) to form a blocking layer on the dielectric film. Subsequently, the patterned wafer was sequentially exposed to tri-tertbutylaluminum and/or isomers thereof and water to selectively form an aluminum oxide film on the metal film. SEM and TEM images of the aluminum oxide deposition on the metal film show that the aluminum oxide selectively deposited on the metal film and not on the dielectric film.

Example 4

Comparative

A patterned wafer having a dielectric film and a metal film thereon were provided. The patterned wafer was first exposed to self-assembled monolayers (SAMs) to form a blocking layer on the dielectric film. Subsequently, the patterned wafer was sequentially exposed to TMA and water to selectively form an aluminum oxide film on the metal film. SEM and TEM images of the aluminum oxide deposition on the metal film show that the aluminum oxide deposited both on the metal film and on the dielectric film.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
    positioning a substrate having a metal layer and a dielectric layer in a processing chamber;
    exposing the substrate, in the absence of trimethylaluminum (TMA), to an organometallic precursor to selectively deposit a metal film on the metal layer relative to the dielectric layer, the metal film comprising aluminum, the organometallic precursor comprising greater than 95% tri-tertbutylaluminum (TTBA) and less than 5% of one or more of bis(2-methyl-2-propanyl)-(2-methyl-1-propanyl)aluminum), (2-methyl-2-propanyl)bis(2-methyl-1-propanyl)aluminum), and tris(2-methyl-1-propanyl)aluminum);
    purging the processing chamber of the organometallic precursor,
    exposing the substrate to an oxidant to react with the metal film to form a metal oxide film on the metal layer, the metal oxide film comprising aluminum oxide; and
    purging the processing chamber of the oxidant,
        wherein the metal oxide film is deposited on the metal layer relative to the dielectric layer in a ratio greater than or equal to 5:1.

2. The method of claim 1, wherein the dielectric layer comprises one or more of oxides, carbon doped oxides, porous silicon dioxide ($SiO_2$), silicon oxide (SiO), silicon nitride (SiN), carbides, oxycarbides, nitrides, oxynitrides, oxycarbonitrides, carbonitrides, polymers, phosphosilicate glass, fluorosilicate (SiOF) glass, or organosilicate glass (SiOCH).

3. The method of claim 1, wherein the dielectric layer is substantially free of the metal oxide film.

4. The method of claim 1, wherein the metal layer comprises one or more of cobalt (Co), tungsten (W), ruthenium (Ru), copper (Cu), nickel (Ni), manganese (Mn), silver (Ag), gold (Au), platinum (Pt), iron (Fe), molybdenum (Mo), or rhodium (Rh).

5. The method of claim 1, wherein the substrate is maintained at a temperature in a range of from 100° C. to 500° C.

6. The method of claim 1, wherein the pressure of the processing chamber is in a range of from 0.5 Torr to 10 Torr.

7. The method of claim 1, wherein the oxidant comprises one or more of water, oxygen, tert-butyl alcohol, 3-butene-2-ol, 2-methyl-3-butene-2-ol, 2-phenyl-2-propanol, or R—OH where R comprises $CF_3$ or $C_{1-20}$ alkyl, $C_{1-20}$ aryl, $C_{1-20}$ alkenyl, or $C_{1-20}$ alkynyl.

8. The method of claim 1, further comprising repeating the method to provide a metal oxide film having a thickness of from 0.5 to 10 nm.

9. The method of claim 1, wherein purging the processing chamber of the organometallic precursor or the oxidant comprises flowing a purge gas over the substrate.

10. The method of claim 9, wherein the purge gas is selected from one or more of Ar, $N_2$, He, $H_2$, or $H_2$-containing gas.

11. A method of depositing a film, the method comprising selectively forming a metal oxide film in a process cycle comprising sequential exposure of a substrate, in the absence of trimethylaluminum (TMA), having a metal layer and a dielectric layer thereon to an organometallic precursor, purge gas, an oxidant, and purge gas, the metal oxide film comprising aluminum, the organometallic precursor comprising greater than 95% tri-tertbutylaluminum (TTBA) and less than 5% of one or more of bis (2-methyl-2-propanyl)-(2-methyl-1-propanyl)aluminum), (2-methyl-2-propanyl)bis (2-methyl-1-propanyl) aluminum), and tris (2-methyl-1-propanyl)aluminum); and
    repeating the process cycle to selectively form a metal oxide film on the metal layer, the metal oxide film having a thickness of from 0.5 nm to 10 nm, and the dielectric layer substantially free of the metal oxide film.

12. The method of claim 11, wherein the metal layer comprises one or more of cobalt (Co), tungsten (W), ruthenium (Ru), copper (Cu), nickel (Ni), manganese (Mn), silver (Ag), gold (Au), platinum (Pt), iron (Fe), molybdenum (Mo), or rhodium (Rh).

13. The method of claim 11, wherein the oxidant comprises one or more of oxygen, tert-butyl alcohol, 3-butene-2-ol, 2-methyl-3-butene-2-ol, 2-phenyl-2-propanol, or R—OH where R comprises $CF_3$ or $C_{1-20}$ alkyl, $C_{1-20}$ aryl, $C_{1-20}$ alkenyl, or $C_{1-20}$ alkynyl.

14. A method of depositing a thin film, the method comprising:
    selectively forming an aluminum oxide film in a process cycle comprising sequential exposure of a substrate, in the absence of trimethylaluminum (TMA), having a metal layer adjacent to a dielectric layer to an aluminum precursor, purge gas, oxidant, and purge gas, the aluminum precursor comprising greater than 95% tri-tertbutylaluminum (TTBA) and less than 5% of one or more of bis(2-methyl-2-propanyl)-(2-methyl-1-propanyl)aluminum), (2-methyl-2-propanyl)bis(2-methyl-1-propanyl)aluminum), and tris(2-methyl-1-propanyl) aluminum); and
    repeating the process cycle to selectively form the aluminum oxide film on the metal layer, the aluminum oxide film having a thickness of from 2 nm to 10 nm, and the dielectric layer substantially free of aluminum oxide.

* * * * *